US011955355B2

(12) United States Patent
Savandaiah et al.

(10) Patent No.: US 11,955,355 B2
(45) Date of Patent: Apr. 9, 2024

(54) ISOLATED VOLUME SEALS AND METHOD OF FORMING AN ISOLATED VOLUME WITHIN A PROCESSING CHAMBER

(71) Applicant: Applied Materials, Inc., Santa Clara, CA (US)

(72) Inventors: Kirankumar Neelasandra Savandaiah, Bangalore (IN); Nitin Bharadwaj Satyavolu, Kakinada (IN); Srinivasa Rao Yedla, Bangalore (IN); Bhaskar Prasad, Jamshedpur (IN); Thomas Brezoczky, Los Gatos, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 589 days.

(21) Appl. No.: 17/185,360

(22) Filed: Feb. 25, 2021

(65) Prior Publication Data

US 2022/0270898 A1 Aug. 25, 2022

(51) Int. Cl.
*H01L 21/67* (2006.01)
*C23C 14/35* (2006.01)
(Continued)

(52) U.S. Cl.
CPC ........ *H01L 21/67126* (2013.01); *C23C 14/35* (2013.01); *C23C 14/50* (2013.01);
(Continued)

(58) Field of Classification Search
CPC ......... H01L 21/67126; H01L 21/67167; H01L 21/67207; H01L 21/67103; H01L 21/6719; H01L 21/67748; H01L 21/67751; H01L 21/68742; C23C 14/35; C23C 14/50; C23C 14/56; H01J 37/32513; H01J 37/32715; H01J 37/3405; H01J 37/3426; H01J 2237/2007; H01J 2237/332

See application file for complete search history.

(56) References Cited

U.S. PATENT DOCUMENTS 7,331,583 B1 * 2/2008 Andre ................... B23B 31/402
269/22
8,088,299 B2 1/2012 Chen et al.
(Continued)

*Primary Examiner* — Caleb E Henry
(74) *Attorney, Agent, or Firm* — Patterson & Sheridan LLP.

(57) ABSTRACT

A method and apparatus for substrate processing and a cluster tool including a transfer chamber assembly and a plurality of processing assemblies. Processing chamber volumes are sealed from the transfer chamber volume using a support chuck on which a substrate is disposed. A seal ring assembly is coupled to the support chuck. The seal ring assembly includes an inner assembly, an assembly bellows circumscribing the inner assembly, and a bellows disposed between the inner and outer platform. An inner ring is disposed between inner assembly of the seal ring assembly and the bottom surface of the support chuck. An outer ring disposed between the seal ring assembly and the lower sealing surface of the process chamber wall. The support chuck is raised to form an isolation seal between the processing chamber volume and the transfer chamber volume using the bellows, the inner ring, and the outer ring.

20 Claims, 9 Drawing Sheets

(51) Int. Cl.
*C23C 14/50* (2006.01)
*H01J 37/32* (2006.01)
*H01J 37/34* (2006.01)

(52) U.S. Cl.
CPC .. *H01J 37/32513* (2013.01); *H01J 37/32715* (2013.01); *H01J 37/3405* (2013.01); *H01J 37/3426* (2013.01); *H01J 2237/2007* (2013.01); *H01J 2237/332* (2013.01); *H01L 21/67167* (2013.01); *H01L 21/67207* (2013.01)

(56) References Cited

U.S. PATENT DOCUMENTS

| | | | |
|---|---|---|---|
| 10,702,971 | B2 | 7/2020 | Oh et al. |
| 2003/0232561 | A1* | 12/2003 | Yawata ................ B32B 37/10 445/24 |
| 2005/0233547 | A1* | 10/2005 | Noda ................. H01L 21/6835 438/459 |
| 2006/0252233 | A1* | 11/2006 | Honma ............. H01L 21/67132 438/464 |
| 2010/0032087 | A1* | 2/2010 | Takahashi ......... H01L 21/67132 428/335 |
| 2017/0051184 | A1* | 2/2017 | Yoo ........................ C09J 7/381 |
| 2019/0371578 | A1* | 12/2019 | Larosa .............. H01L 21/68785 |
| 2020/0381275 | A1 | 12/2020 | Brezoczky et al. |
| 2020/0381276 | A1 | 12/2020 | Yedla et al. |

* cited by examiner

ISOLATED VOLUME SEALS AND METHOD OF FORMING AN ISOLATED VOLUME WITHIN A PROCESSING CHAMBER

BACKGROUND

Field

Embodiments described herein generally relate to methods and apparatus for isolating a chamber volume within a substrate processing chamber. More particularly, embodiments of the disclosure relate to substrate processing platforms, which employ multiple processing chambers for processing substrates therein.

Description of the Related Art

Conventional cluster tools for the processing of substrates by deposition of materials thereon, the etching of substrates or materials thereon, or other processes used during the fabrication of integrated circuit chips, are configured to perform one or more processes during substrate processing therein. For example, a cluster tool can include a physical vapor deposition (PVD) chamber to perform a PVD process on a substrate, an atomic layer deposition (ALD) chamber for performing an ALD process on a substrate, a chemical vapor deposition (CVD) chamber for performing a CVD process on a substrate, an etch chamber for performing an etch process on a substrate, a thermal processing chamber for performing a thermal process on a substrate, a plasma ion implant chamber for implanting ions into a substrate or a film layer formed thereon, and/or one or more other processing chambers.

The aforementioned cluster tools have limitations, such as mechanical limits on the throughput of substrates therein, the level of particulates (particles) present in the substrate processing environment, and restrictions on process conditions within process chambers on the cluster tool. Therefore, what is needed in the art is a cluster tool capable of improving the mechanical throughput, and increasing process condition flexibility between process chambers within the same cluster tool.

Therefore, there is a need for an improved cluster tool capable of configuring multiple processing assemblies for processing substrates.

SUMMARY

The present disclosure generally relates to a bellows assembly and method of isolating a chamber volume within a substrate processing chamber utilizing the bellows assembly.

In one example, a substrate processing chamber includes an upper wall, and a bottom wall, and a liner disposed between the upper wall and the bottom wall. A containment member is coupled to an internal surface of the liner. The containment member has a lower sealing surface. A support chuck has a substrate supporting surface, and a bottom surface opposite the substrate supporting surface. A seal ring assembly is coupled to the bottom surface of the support chuck. The seal ring assembly includes an upper bellows ring, a lower bellows ring attached to an inner assembly; and an assembly bellows disposed between the upper bellows ring and the lower bellows ring. A lift assembly is configured to move the support chuck between a transfer position and a processing position. In the transfer position, the substrate supporting surface is exposed to a first region. In the processing position, the substrate support is in a second region isolated from the first region by contact between the seal ring assembly, the outer ring seal, and the lower sealing surface of the containment member. An outer seal ring is disposed between the upper bellows ring and the lower sealing surface. The outer seal ring has an outer sealing surface. The outer seal ring extends radially around a center of the seal ring assembly.

In another example, an apparatus is configured to simultaneously process a plurality of substrates. A transfer chamber assembly has one or more walls that define a transfer volume. A substrate processing assembly includes an upper wall, a bottom wall, a liner disposed between the upper wall and the bottom wall, and a containment member coupled to an internal surface of the liner. The containment member has a lower sealing surface. Each substrate processing assembly has a support chuck that has a substrate supporting surface, and a bottom surface opposite the substrate supporting surface. A seal ring assembly is coupled to the bottom surface of the support chuck. The seal ring assembly includes an upper bellows ring, a lower bellows ring attached to an inner assembly, and an assembly bellows disposed between the upper bellows ring and the lower bellows ring. A lift assembly is configured to move the support chuck between a transfer position and a processing position. In the transfer position, the substrate supporting surface is exposed to a first region. In the processing position, the substrate support is in a second region isolated from the first region by contact between the seal ring assembly, the outer ring seal, and the lower sealing surface of the containment member. An outer seal ring is disposed between the upper bellows ring and the lower sealing surface. The outer seal ring has an outer sealing surface. The outer seal ring extends radially around a center of the seal ring assembly. The outer sealing surface forms an isolation seal with the lower sealing surface and forms a sealed process chamber volume.

In yet another example, a semiconductor processing system is disclosed. The semiconductor processing system includes a substrate processing chamber having a plurality of chamber walls forming a chamber volume therebetween. The semiconductor processing system further includes a non-transitory computer readable medium storing instructions. The instructions, when executed by a processor, cause a method to be performed in the substrate processing chamber. The method includes positioning a substrate and a support chuck into a first position on a robotic transfer device within a transfer volume. The method also includes raising a lift assembly to couple to the support chuck, and disengaging the support chuck from the robotic transfer device. The support chuck is raised to a second position with the lift assembly. Additionally, the method includes sealing an outer sealing surface of an outer seal ring against a lower sealing surface of at least one chamber wall to form a processing volume. The processing volume is smaller than the chamber volume. The processing volume is fluidly isolated from the transfer volume. Further, the method includes processing the substrate in the processing volume.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the Figures. It is contemplated that elements and features of one embodiment may be beneficially incorporated in other embodiments without further recitation.

DETAILED DESCRIPTION

Figure 1A:
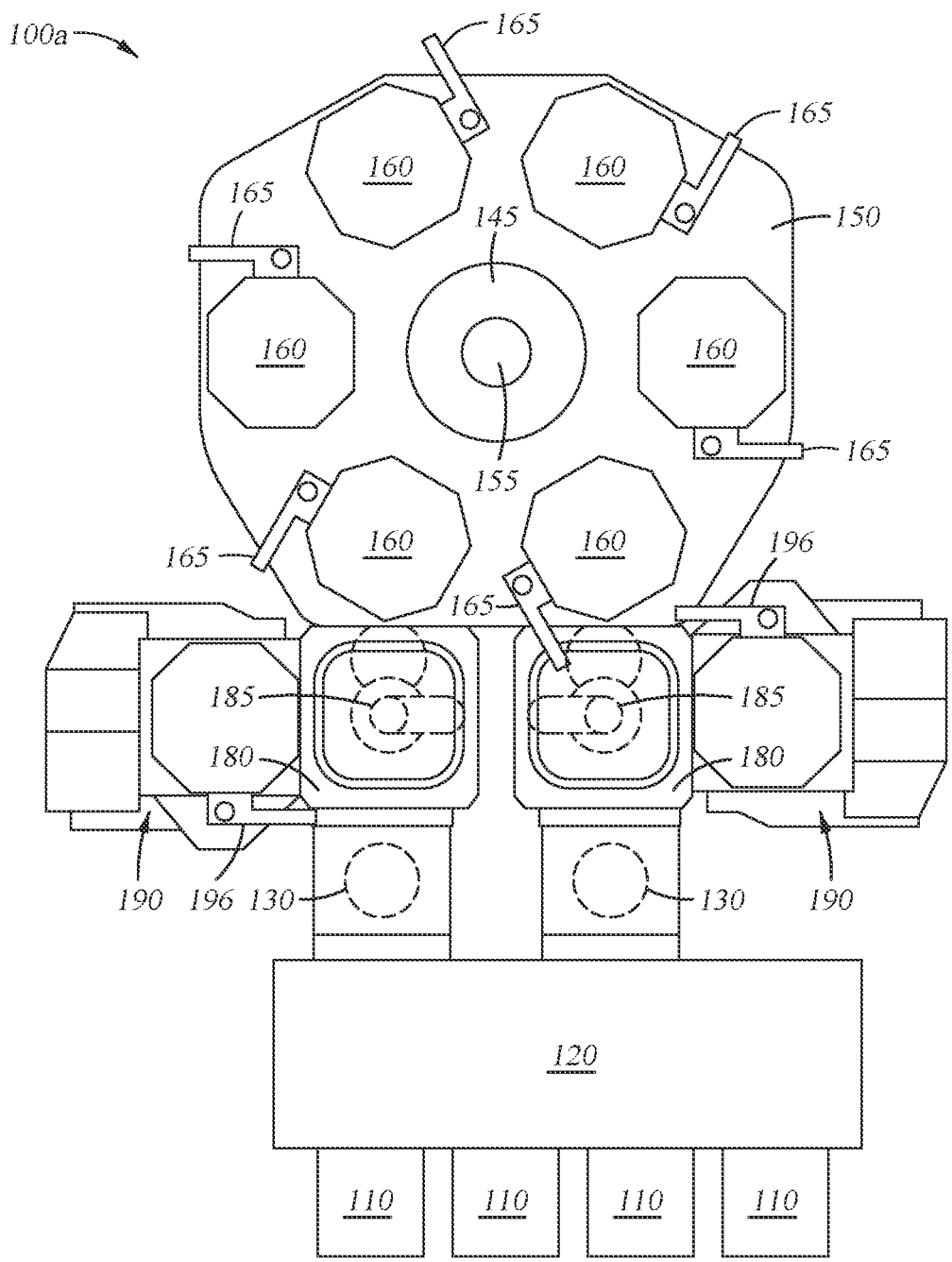
FIGS. 1A-1B are plan views of cluster tool assemblies with transfer chamber assemblies and processing assemblies as described herein.

The present disclosure generally relates to a bellows assembly and method of utilizing the bellows assembly for isolating a chamber volume within a substrate processing chamber.

A transfer chamber assembly and processing assemblies may include processing platforms for ALD, CVD, PVD, etch, cleaning, implanting, heating, annealing, and/or polishing processes. Other processing platforms may also be used with the present disclosure. The present disclosure generally provides a substrate processing tool with increased process condition flexibility between process assemblies within the same cluster tool.

The present disclosure includes embodiments for substrate processing. A substrate, and optionally a support chuck, may be transported between processing assemblies within a transfer volume formed by a transfer chamber assembly. The processing assemblies include processing volumes in which the substrate is processed. In one example, the support chuck can be detach from a lift assembly while being transported between processing assemblies. When the substrate and the support chuck are disposed on the lift assembly, the lift assembly raises the substrate and support chuck to a processing position. While in the processing position, surfaces of the processing assembly and the support chuck seal against one another to form a fluidly isolated, sealed processing volume. The sealed processing volume is fluidly isolated from the transfer volume formed by the transfer chamber assembly.

The isolation of the processing volume from the transfer volume by the movement of a bellows assembly attached to the lift assembly allows for each of the processing volumes to be adjusted to different pressures. Advantageously, forming the processing volume with the bellows assembly enables different substrate processing operations to be performed within each of the processing assemblies within the transfer chamber assembly, even when each processing operation requires different pressures and temperatures. The use of the bellows assembly as the sealing member within the processing assembly also minimizes the volume of the processing volume. Minimizing the processing volume decreases the amount of process gases and purge gases required during each process. The sealing between each processing volume and the transfer volume additionally minimizes process gas leakage into the transfer chamber. The apparatus and method utilized to create a seal between the processing volumes and the transfer volume minimize particle contamination within the processing volumes, and decrease downtime of the apparatus caused by part replacement and cleaning.

The lift assembly is physically coupled to the bellows assembly. The bellows assembly includes an elastomer seal that forms a vacuum isolation within cavity for varying pressure (Low Vacuum to UHV) and temperatures ranging from Room Temperature (RT), i.e., about 20 degrees C. to about 250 degrees C. Advantageously, a transfer volume can be maintained at one temperature and pressure, and the individual processing assemblies can form smaller processing volumes, thus utilizing less processing and purge gases, and overall reducing the power needed to process the substrate. In addition, the individualized processing volumes result in a reduction or elimination of components, such as doors, valves, and locks used to isolate processing environments in conventional processing chambers.

Figure 1B:
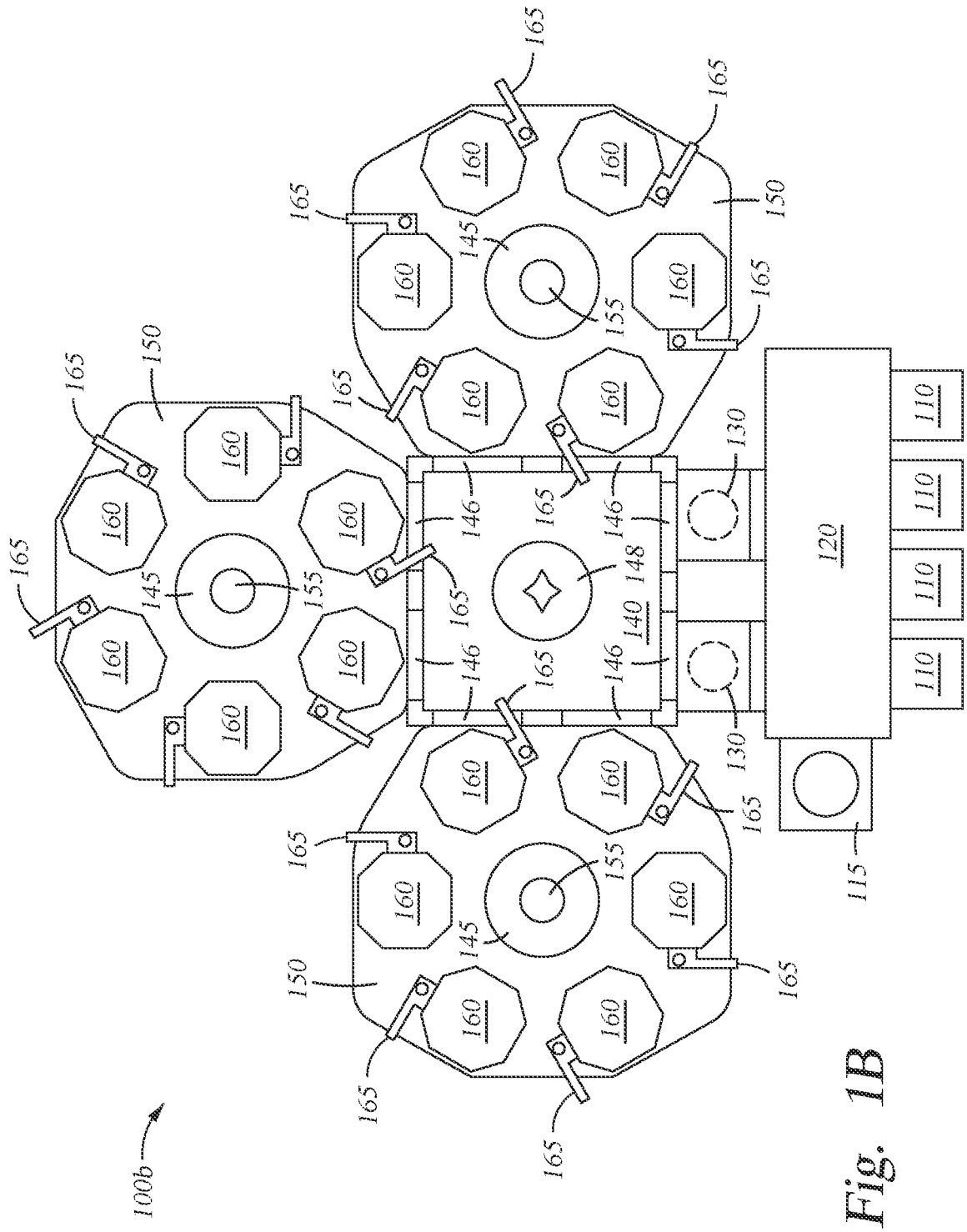

FIGS. 1A-1B are plan views of cluster tool assemblies 100a, 100b with transfer chamber assemblies 150 and processing assemblies 160 as described herein. The cluster tool assembly 100a of FIG. 1A includes a single transfer chamber assembly 150 and a plurality of front end robot chambers 180 between the transfer chamber assembly 150 and load lock chambers 130. The cluster tool assembly 100b of FIG. 1B includes multiple transfer chamber assemblies 150 and a buffer chamber 140 disposed between the transfer chamber assemblies 150 and load lock chambers 130.

In FIG. 1A, the cluster tool assembly 100a includes Front Opening Unified Pods (FOUPs) 110, a Factory Interface (FI) 120 adjacent to and operably connected to the FOUPs 110, load lock chambers 130 adjacent to and operably connected to the FI 120, front end robot chambers 180 adjacent to and operatively connected to the load lock chambers 130, prep chambers 190 adjacent to and operatively connected to the front end robot chambers 180, and a transfer chamber assembly 150 connected to the front end robot chambers 180.

The FOUPs 110 are utilized to safely secure and store substrates during movement thereof between different substrate processing equipment, as well as during the connection of the FOUPs to the substrate processing equipment while the substrates are disposed therein. The number of FOUPs 110 (four shown) may vary in quantity depending upon the processes run in the cluster tool assembly 100a. The throughput of the cluster tool assembly 100a also, at least in part, defines the number of docking stations on the FI 120 to which the FOUPs are connected for the unloading of substrates therefrom and the loading of substrates therein. The FI 120 is disposed between the FOUPs 110 and the load lock chambers 130. The FI 120 creates an interface between a semiconductor fabrication facility (Fab) and the cluster tool assembly 100a. The FI 120 is connected to the load lock chambers 130, such that substrates are transferred from the FI 120 to the load lock chambers 130 and from the load lock chambers 130 and into the FI 120.

The front end robot chambers 180 are located on the same side of each of the load lock chambers 130, such that the load lock chambers 130 are located between the FI 120 and the front end robot chambers 180. The front end robot chambers 180 each include a transfer robot 185 therein. The transfer robot 185 is any robot suitable to transfer one or more substrates from one chamber to another, through or via the front end robot chamber 180. In some embodiments, as shown in FIG. 1A, the transfer robot 185 within each front end robot chamber 180 is configured to transport substrates from one of the load lock chambers 130 and into one of the prep chambers 190.

The prep chambers 190 may be any one of a pre-clean chamber, an anneal chamber, or a cool down chamber, depending upon the desired process within the cluster tool assembly 100a. In some embodiments, the prep chambers 190 are plasma clean chambers. In yet other exemplary embodiments, the prep chambers 192 are Preclean II chambers available from Applied Materials, Inc., of Santa Clara, Calif. A vacuum pump 196 is positioned adjacent to each of the prep chambers 192. The vacuum pumps 196 are configured to pump the prep chambers 190 to a predetermined pressure. In some embodiments, the vacuum pump 196 is configured to decrease the pressure of the prep chamber 192, such as to create a vacuum within the prep chamber 192.

As shown in FIG. 1A, two load lock chambers 130, two front end robot chambers 180, and two prep chambers 190 are configured within the cluster tool assembly 100a. The two load lock chambers 130, the two front end robot chambers 180, and the two prep chambers 190, when arranged as shown in FIG. 1A and described above, may form two transport assemblies. The two transport assemblies may be spaced from each other and may form mirror images of one another, such that the prep chambers 190 are on opposite walls of their respective front end robot chambers 180.

The transfer chamber assembly 150 is adjacent to, and operatively connected to, the front end robot chambers 180, such that substrates are transferred between the transfer chamber assembly 150 and front end robot chambers 180. The transfer chamber assembly 150 includes a central transfer device 145 and a plurality of processing assemblies 160 therein. The plurality of processing assemblies 160 are disposed around the central transfer device 145, radially outward of a pivot or central axis of the central transfer device 145 in the transfer chamber assembly 150.

A chamber pump 165 is disposed adjacent to, and in fluid communication with, each of the processing assemblies 160, such that there are a plurality of chamber pumps 165 disposed around the central transfer device 145. The plurality of chamber pumps 165 are disposed radially outward of the central transfer device 145 in the transfer chamber assembly 150. As shown in FIG. 1A, one chamber pump 165 is fluidly coupled to each of the processing assemblies 160.

In some embodiments, there may be multiple chamber pumps 165 fluidly coupled to each processing assembly 160. In yet other embodiments, one or more of the processing assemblies 160 may not have a chamber pump 165 directly fluidly coupled thereto. In some embodiments a varying number of chamber pumps 165 are fluidly coupled to each processing assembly 160, such that one or more processing assemblies 160 may have a different number of chamber pumps 165 than one or more other processing assemblies 160. The chamber pumps 165 enable separate vacuum pumping of processing regions within each processing assembly 160, and thus the pressure within each of the processing assemblies may be maintained separately from one another and separately from the pressure present in the transfer chamber assembly 150.

FIG. 1A depicts an embodiment having six processing assemblies 160 within the transfer chamber assembly 150. However, other embodiments may have a different number of processing assemblies 160 within the transfer chamber 150. For example, in some embodiments, two to twelve processing assemblies 160 may be positioned within the transfer chamber assembly 150, such as four to eight processing assemblies 160. In other embodiments, four processing assemblies 160 may be positioned within the transfer chamber assembly 150. The number of processing assemblies 160 impact the total footprint of the cluster tool 100a, the number of possible process steps capable of being performed by the cluster tool 100a, the total fabrication cost of the cluster tool 100a, and the throughput of the cluster tool 100a.

Each of the processing assemblies 160 can be any one of PVD, CVD, ALD, etch, cleaning, heating, annealing, and/or polishing platforms. In some embodiments, the processing assemblies 160 are all one type of processing platform. In other embodiments, the processing assemblies 160 include two or more different processing platforms. In one exemplary embodiment, all of the processing assemblies 160 are PVD process chambers. In another exemplary embodiment, the processing assemblies 160 include both PVD and CVD process chambers. The plurality of processing assemblies 160 can be altered to match the types of process chambers needed to complete a semiconductor fabrication process.

The central transfer device 145 is disposed at generally the center of the transfer chamber assembly 150, such that a central axis 155 of the transfer chamber assembly 150 is disposed through the central transfer device 145. The central transfer device 145, is any suitable transfer device configured to transport substrates between each of the processing assemblies 160. In one embodiment, the central transfer device 145 is a central robot having one or more blades configured to transport substrates between each processing assembly 160. In another embodiment, the central transfer device is a carousel system by which processing regions are moved along a circular orbital path centered on the central axis 155 of the transfer chamber assembly 150.

FIG. 1B is a plan view of the cluster tool 100b with multiple transfer chamber assemblies 150 connected thereto. The FOUPs 110, FI 120, and load lock chambers 130 may be arranged similarly to the FOUPs 110, FI 120, and load lock chambers 130 described above in relation to FIG. 1A. The cluster tool 100b of FIG. 1B further includes an FI etch apparatus 115, a buffer chamber 140, and a plurality of transfer chamber assemblies 150.

The FI etch apparatus 115 is positioned adjacent to the FI 120, such that the FI etch apparatus 115 is disposed on a side wall of the FI 120. The FI etch apparatus 115 may be positioned on a side wall of the FI 120 that is separate from the side walls of the FI that are connected to the FOUPs 110 and the load lock chambers 130. The FI etch apparatus 115 may be an etch chamber. The FI etch apparatus 115 may be similar to the Centris® line of etch chambers available from Applied Materials, Inc.

The buffer chamber 140 is located between the load lock chambers 130 and the plurality of transfer chamber assemblies 150 and provides an isolatable volume through which substrates may be transferred among and between the load lock chambers 130 and the multiple transfer chamber assemblies 150. The buffer chamber 140 is coupled to both the load lock chambers 130 and the plurality of transfer chamber assemblies 150. As shown in FIG. 1B, three transfer chamber assemblies 150 are disposed around and attached to the buffer chamber 140. In other embodiments, there may be one, two, or more than three transfer chamber assemblies 150 disposed around the buffer chamber 140.

The buffer chamber 140 includes least one opening 146 along each wall of the buffer chamber 140 that is in contact with a transfer chamber assembly 150 or a load lock chamber 130. Each of the openings 146 is sized to allow the passage of a substrate, a substrate chuck, or a substrate on a substrate chuck to and from the transfer chamber assemblies 150. In some embodiments, there are two openings 146 along each wall of the buffer chamber 140 that is adjacent to the transfer chamber assemblies 150. This allows for the passage of two substrates to the transfer chamber assemblies 150 from the buffer chamber 140 or from the transfer chamber assemblies 150 to the buffer chamber 140 simultaneously.

The buffer chamber 140 includes one or more buffer chamber transfer robots 148. The buffer chamber transfer robots 148 move substrates, chucks, or both substrates and chucks between the transfer chamber assemblies 150 and the load lock chambers 130. The buffer chamber transfer robots 148 may be any suitable substrate transfer robot.

To enable isolation of the buffer chamber 140 internal volume from process gases used in the process assemblies 160 of the transfer chamber assemblies 150, access between each transfer chamber assembly 150, and the openings 146 in the buffer chamber 140 are selectively sealed by a respective fluid isolation valve, such as a slit valve. The fluid isolation valves (not shown) are disposed within the wall of each of the transfer chamber assemblies 150, the wall of the buffer chamber 140, or as a separate assembly between the buffer chamber 140 and the transfer chamber assembly 150. Additionally, the fluid isolation valves may include a plate and seal assembly 292 (FIG. 2A-3B) which is pressed by a selectively operable ram to selectively cover and seal, or uncover, the respective opening 146. The plate and seal assembly 292 thereby selectively seals, or allows, fluid communication between the transfer chamber assembly 150 and the buffer chamber 140 and also allows, when retracted away from an opening 146, a support blade or end effector on the buffer chamber transfer robot 148 in the buffer chamber 140 to transport a substrate through the opening 146.

The transfer chamber assemblies 150 may be configured the same as the one described above in relation to FIG. 1A. This includes the placement and structure of the central transfer devices 145, the plurality of processing assemblies 160, and the chamber pumps 165 within each of the transfer chamber assemblies 150. However, alternative embodiments of the transfer chamber assemblies 150 may be utilized.

Figure 2A:
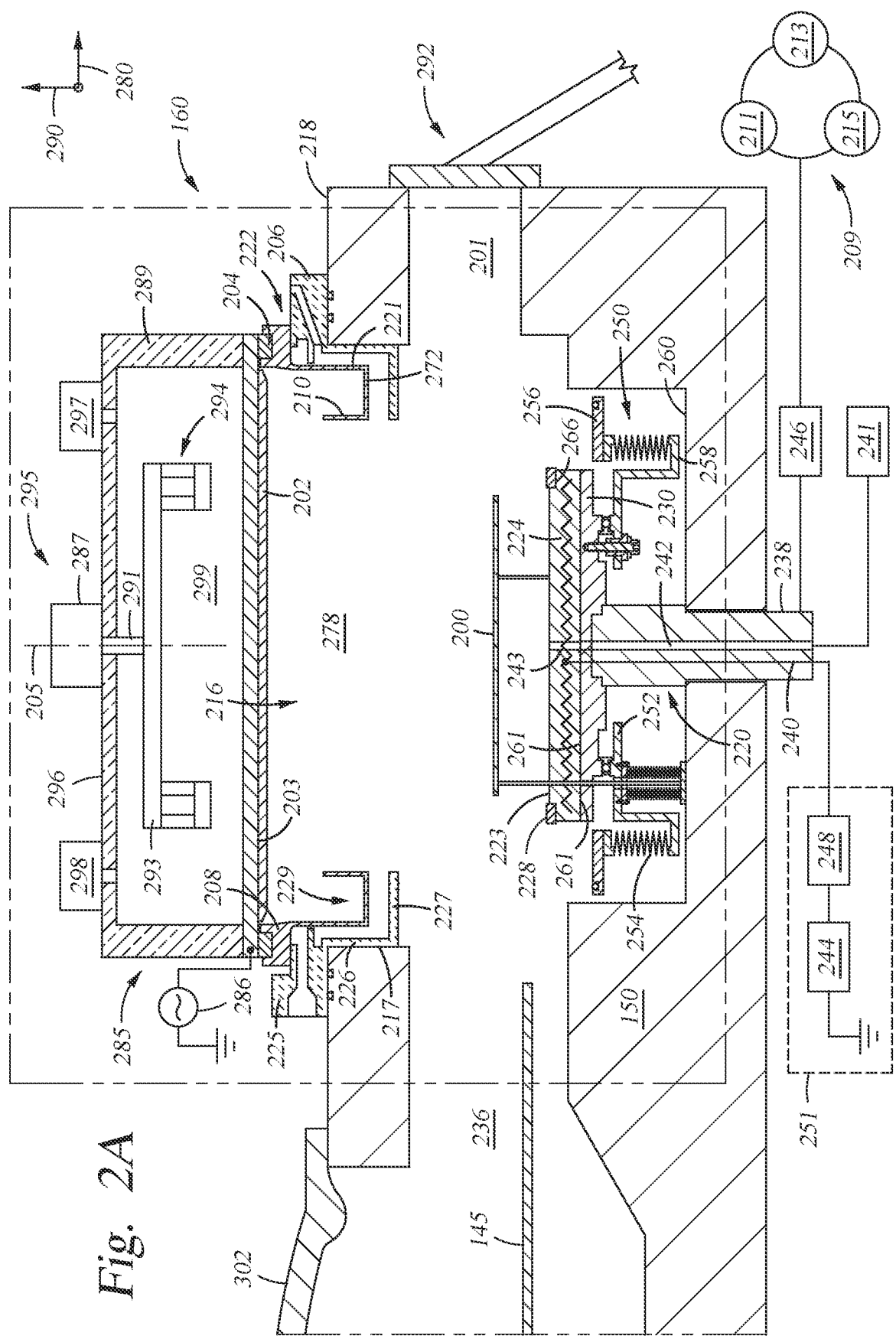
FIG. 2A-2B are schematic cross sectional views of a transfer chamber assembly and a processing assembly according to a first embodiment.
Figure 2B:
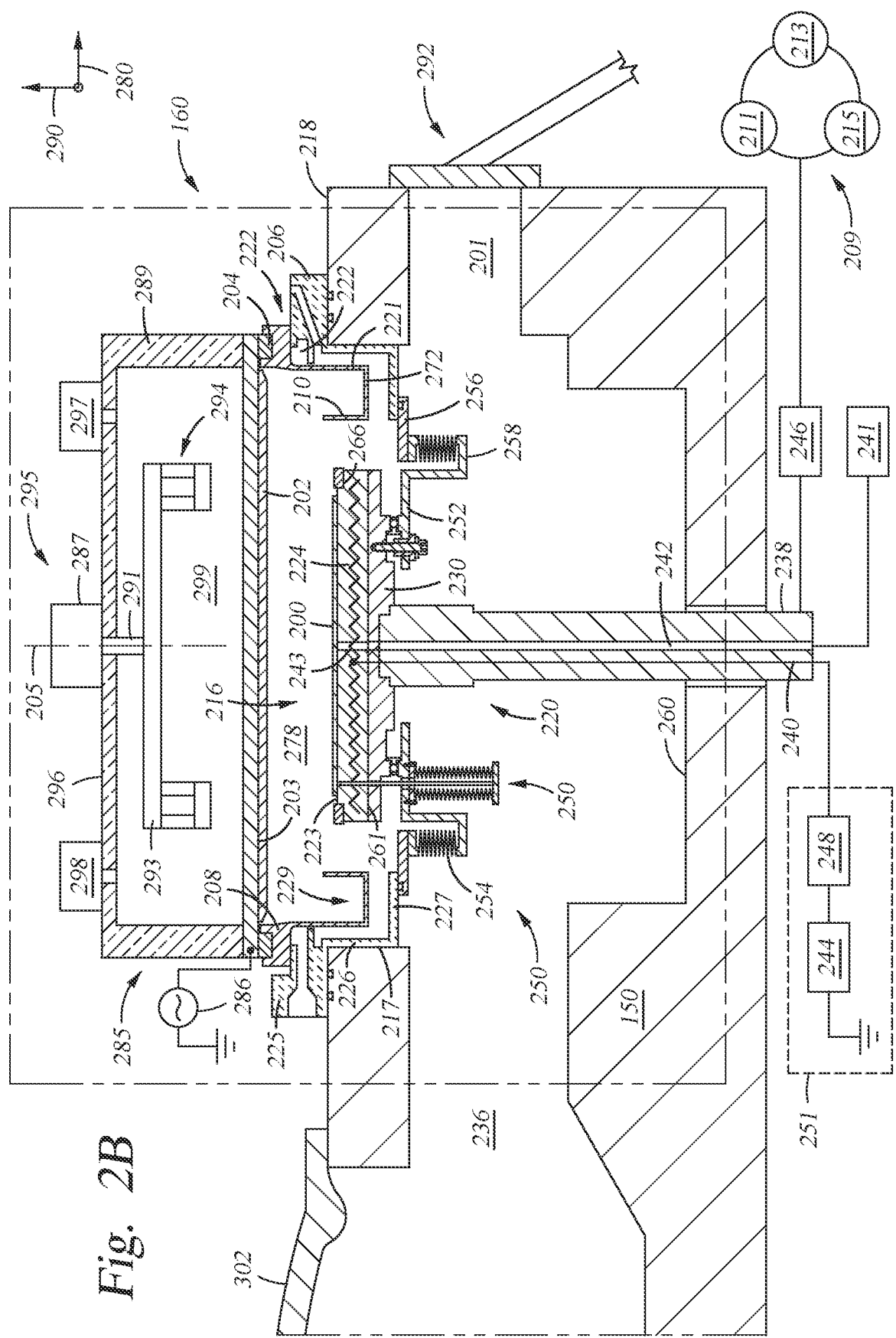

FIGS. 2A-2B are schematic cross sectional views of a portion of a transfer chamber assembly 150 and a processing assembly 160 according to a first embodiment. In the first embodiment, the transfer chamber assembly 150 includes a robot, such as the central transfer device 145 (FIGS. 1A and 1B), to transfer a substrate 200 onto a substrate support surface 223 of a support chuck 224 within the processing assembly 160. The support chuck 224 is attached to a substrate lift assembly 220 within the processing assembly 160. The processing assembly 160 further includes a magnetron assembly 295 and a mini process chamber 216.

FIG. 2A depicts the processing assembly 160 while the substrate lift assembly 220 is in a lowered, substrate receiving position in which the substrate 200 is positioned below the mini process chamber 216. FIG. 2B depicts the processing assembly 160 while the substrate lift assembly is in a raised, processing position in which the substrate 200 is positioned within the mini process chamber 216. In one configuration, the support chuck 224 remains attached to the substrate lift assembly 220 both during transportation of the substrate 200 between the processing assemblies 160, and during substrate processing within the mini process chamber 216.

The processing assembly 160 of FIG. 2A includes the magnetron assembly 295, a portion of a transfer volume 236, a portion of the transfer chamber assembly 150, the mini process chamber 216, the support chuck 224, and the substrate lift assembly 220. The processing assembly 160 of FIG. 2A shows the substrate lift assembly 220 in a substrate receiving position (i.e., a transfer position), such that the support chuck 224 and the substrate 200 are fluidically coupled to the transfer volume 236. The lift assembly 220 is proximate a bottom chamber wall 260 when positioned in the transfer position.

An opening 201 and a plate and seal assembly 292 are disposed adjacent to the processing assembly 160. The opening 201 is on an outer sidewall of the transfer chamber assembly 150. The opening 201 is sized to allow a substrate 200 and a robot arm carrying the substrate 200 to pass therethrough. In one example, the robot arm may be the transfer robot 185 within the front end robot chambers 180 (FIG. 1A). Alternatively, the robot is the buffer chamber transfer robot 148 of the buffer chamber 140 (FIG. 1B). The opening 201 is sealed from the front end robot chambers 180 and/or the buffer chamber 140 between movement of the substrates 200 to and from the transfer chamber assembly 150. The opening 201 is sealed using the plate and seal assembly 292 disposed on the outside of the opening 201. In embodiments in which the buffer chamber 140 is utilized, the opening 201 is adjacent to and aligned with the respective opening 146 of the buffer chamber 140.

In some embodiments, the mini process chamber 216 is a physical vapor deposition (PVD) process chamber, wherein a material to form a layer on a substrate 200 exposed therein is sputtered from a sputtering target assembly 203. Thus, the mini process chamber 216 herein includes the sputtering target assembly 203, a dielectric isolator 204, a liner 206, a containment member 208, the magnetron assembly 295, and a lid member 296. Contained within the mini process chamber 216 is a chamber volume 278.

The sputtering target assembly 203 is disposed on top of, and forms the enclosing cover of, the chamber volume 278. There, the sputtering target assembly 203 is circular as viewed from above and has a flat, i.e., generally planar, top surface. An annular surface of the sputtering target assembly 203 is disposed on the dielectric isolator 204, which is a dielectric material having sufficient dielectric strength and size to electrically isolate the sputtering target assembly 203 from the liner 206. The sputtering target assembly 203 is connected to an AC power source 286. The AC power source 286 powers the sputtering target assembly 203, such that the sputtering target assembly 203 is biased during substrate processing.

The dielectric isolator 204 is annular in shape, such that the dielectric isolator 204 has a radial width and surrounds a hollow inner-radius portion. The dielectric material of the dielectric isolator 204 is any material capable of electrically isolating the sputtering target assembly 203 from the liner 206, and also provides thermal isolation therebetween. The liner 206 is in mechanical contact with at least a portion of a top surface 218 of the transfer chamber assembly 150. The liner 206 is also in contact with a portion of the containment member 208, which provides shielding between a flux of sputtered material from the sputtering target assembly 203 and an inner facing sidewall 217 of the of the liner 206. In one example, the containment member 208 is coupled to an internal surface of the liner 206.

The sputtering target assembly 203 is disposed between the chamber volume 278 and a magnetron volume 299, defined by magnetron support walls 289 and the lid member 296. An edge of a sputtering target 202 within the sputtering target assembly 203 is located inwardly of the containment member 208 and the dielectric isolator 204. The sputtering target 202 is composed of the material to be deposited on a surface of the substrate 200 during sputtering. The sputtering target 202 may be a copper sputtering target for depositing as a seed layer in high aspect ratio features formed in the substrate 200. The sputtering target 202 may also include other materials, such as a copper-doped aluminum sputtering target. Alternatively, the sputtering target 202 is composed of a liner/barrier material used to line the surfaces of a trench, via or contact opening in a dielectric layer, and the material deposited on the surfaces of a trench, via, or contact opening is composed of the target material, and in some cases a compound formed of the target material. For example, a tantalum layer with an overlying tantalum nitride layer thereon can be formed on the surfaces of a trench, via, or contact opening by first sputtering the target in an inert gas environment, and then adding nitrogen into the process volume. Alternatively, a first metal of a first target material is sputtered onto the substrate 200 including the surfaces of a trench, via, or contact opening thereon. The substrate 200 is moved to a second chamber having the same or different target composition, and a reactant such as nitrogen is introduced into the process volume to form the compound layer over the non-compound layer.

The liner 206 is an annular member. The liner 206 includes a main supporting portion 225 disposed on the top surface 218 of the transfer chamber assembly 150. The main supporting portion 225 includes an upper annular ledge on which the dielectric isolator 204 is disposed. The dielectric isolator 204 is physically supported by the main supporting portion 225 of the liner 206. The liner 206 includes a downwardly projected annular portion 226. The downwardly projected annular portion 226 is disposed downward from the main supporting portion 225 of the liner 206. The downwardly projected annular portion 226 is a vertical portion that extends from a bottom surface of the main supporting portion 225. A horizontal ringed portion 227 of the liner 206 is disposed on the distal bottom end of the downwardly projected annular portion 226. The horizontal ringed portion 227 extends radially inward from the downwardly projected annular portion 226 with respect to a processing assembly central axis 205. The horizontal ringed portion 227 is disposed underneath a lower annular portion 272 of the containment member 208. In the embodiment shown in FIGS. 2A-2B, the horizontal ringed portion 227 of the liner 206 is disposed underneath part of the lower annular portion 272 of the containment member 208. In some embodiments, the horizontal ringed portion 227 of the liner 206 may be disposed underneath the entirety of the lower annular portion 272 of the containment member 208.

The containment member 208 includes an upper shield body 222 and a lower shield body 229. The upper shield body 222 is a cylindrical body. The upper shield body 222 is disposed radially inwards of the main supporting portion 225 of the liner 206 with respect to the central axis 205. The upper shield body 222 is disposed on top of the lower shield body 229. The lower shield body 229 is a U-shaped body.

The lower shield body 229 includes a first cylindrical lower portion 221, a second cylindrical lower portion 210, and the lower annular portion 272. The first cylindrical lower portion 221 is disposed radially outward of the upper shield body 222 with respect to the processing assembly central axis 205. The first cylindrical lower portion 221 connects to the bottom of the upper shield body 222. The first cylindrical lower portion 221 is a ring and extends vertically downwards from the upper shield body 222. The lower annular portion 272 is connected to the distal end of the first cylindrical lower portion 221 furthest from the upper shield body 222. The lower annular portion 272 is a horizontal member that extends radially inwards from the first cylindrical lower portion 221. The lower annular portion 272 connects the first cylindrical lower portion 221 with the second cylindrical lower portion 210. The lower annular portion 272 is connected to the lower distal end of the second cylindrical lower portion 210. The second cylindrical lower portion 210 is a vertical cylindrical wall disposed above the lower annular portion 272. The second cylindrical lower portion 210 is disposed radially inward of the first cylindrical lower portion 221 and is concentric with at least a portion of the first cylindrical lower portion 221.

The magnetron assembly 295 is disposed over the sputtering target assembly 203. The magnetron assembly 295 includes a plurality of magnets 294 supported by a base plate 293 connected to a shaft 291, which is axially aligned with the central axis 205 of the mini process chamber. The shaft 291 is connected to a motor 287 disposed on the opposite side of the lid member 296 of the magnetron assembly 295. The motor 287 spins the shaft 291 so that the magnets 294 rotate within the magnetron volume 299. The magnetron volume 299 is defined by the lid member 296, the magnetron support walls 289 and the sputtering target assembly 203. In one implementation, the magnets produce a magnetic field within the mini process chamber 216 near the front face of the sputtering target assembly 203 to maintain a plasma generated therein, such that a significant flux of ionized gas atoms strike the sputtering target assembly 203, causing sputter emissions of target material. The magnets are rotated about the central axis 205 of the mini process chamber to increase uniformity of the magnetic fields across the surface of the sputtering target assembly 203.

Fluid is delivered through the magnetron volume 299 in order to control the temperature of the magnets 294 and the sputtering target assembly 203. The fluid is delivered into the magnetron volume 299 by a fluid supply 297 and flown out of the magnetron volume by a fluid evacuator 298. The fluid supply 297 and the fluid evacuator 298 are on opposite sides of the magnetron assembly 295, such that fluid is flown through the magnetron volume 299, across the top of the sputtering target assembly 203, and over the magnets 294. The fluid may be de-ionized (DI) water or other suitable cooling fluids.

The magnetron assembly 295, the AC power source 286, the sputtering target assembly, and the containment member 208 form a process component 285. The process component 285 may be selectively modified to perform different processes within the chamber volume 278. In some embodiments, the process component 285 may be modified to include a showerhead assembly, a remote plasma source, a plurality of heating elements, or sensors. In the embodiments described herein, the process component 285 is configured to enable a PVD process. In alternative embodiments, the process component 285 is modified so that the processing assemblies 160 are capable of performing CVD, ALD, etch, anneal, or cleaning processes.

At least one controller 209 is coupled to the processing assembly 160. The controller 209 includes a processor 211, a memory 213, and support circuits 215 that are coupled to one another. The processor 211 may be one of any form of general purpose microprocessor, or a general purpose central processing unit (CPU), each of which can be used in an industrial setting, such as a programmable logic controller (PLC), supervisory control and data acquisition (SCADA) systems, or other suitable industrial controller. The memory 213 is non-transitory and may be one or more of readily available memory such as random access memory (RAM), read only memory (ROM), or any other form of digital storage, local or remote. The memory 213 contains instructions, that when executed by the processor 211, facilitates execution of the method 700. The instructions in the memory 213 are in the form of a program product such as a program that implements the method of the present disclosure. The program code of the program product may conform to any one of a number of different programming languages. Illustrative computer-readable storage media include, but are not limited to: (i) non-writable storage media (e.g., read-only memory devices within a computer such as CD-ROM disks readable by a CD-ROM drive, flash memory, ROM chips, or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are examples of the present disclosure.

The substrate lift assembly 220 includes the support chuck 224, an upper lift section 230, and a seal ring assembly 250. The support chuck 224 includes an edge ring 228, and the upper lift section 230. The support chuck 224 is coupled to a pedestal 238, and both the support chuck 224 and the pedestal 238 are connected by an electrical line 240, a backside gas outlet 243, and a gas line 242. The substrate 200 is disposed on the substrate supporting surface 223 of the support chuck 224.

The support chuck 224 supports the substrate 200 and the edge ring 228. In the embodiment shown, the support chuck 224 is an electrostatic chuck, such that the support chuck 224 can be biased by an electrical power source, such as a power source 244. The biasing of the support chuck 224 chucks the substrate 200 and holds the substrate 200 in place on the support chuck 224 during processing and movement of the lift assembly 220. The support chuck 224 may also contain heating elements (not shown) and thermal sensors (not shown). The heating elements and temperature sensors may also be connected to the power source 244 and assist in maintaining a uniform and controlled temperature across the substrate supporting surface 223 and the substrate 200 disposed thereon.

The support chuck 224 includes an electrode, which may be a bias electrode. The electrode is electrically coupled to a bias unit 251 via electrical line 240. The bias unit 251 includes the power source 244 and a filter 248. In one example, the filter 248 is an impedance matching circuit. The power source 244 may be DC power, pulsed DC power, RF power, pulsed RF power, or a combination thereof. The substrate 200 may be subjected to an electrical bias using the electrode.

The pedestal 238 of the substrate lift assembly 220 is coupled to an actuator 246, which includes one or more motors. The controller 209 is coupled to the substrate lift assembly 220 via the actuator 246. The actuator 246 enables vertical and rotational movement of the support chuck 224, such that the support chuck 224 can move vertically upwards and downwards through the transfer volume 236 and rotationally about the central axis 205.

The support chuck 224 has a planar upper surface that forms the substrate supporting surface 223. The support chuck 224 has an outer ledge 266 disposed around the substrate supporting surface 223 of the support chuck 224. The outer ledge 266 is vertically offset from the substrate supporting surface 223. The outer ledge 266 is sized to receive the edge ring 228. The edge ring 228 is disposed radially outward from the substrate supporting surface 223 of the support chuck 224.

The support chuck 224 is disposed on top of the lift assembly 220, such that the support chuck 224 is disposed on top of the upper lift section 230. In one example, the support chuck 224 may detach from the lift assembly 220 while the support chuck 224 is transported between processing assemblies 160. The upper lift section 230 is disposed below an entire bottom surface 261 of the support chuck 224. The upper lift section 230 is disposed on top of the pedestal 238. The pedestal 238 includes the electrical line 240 and the gas line 242 disposed therein. The electrical line 240 may include multiple electrical connections, such as wires. The electrical line 240 connects the support chuck 224 to the power source 244. The electrical line 240 and the power source 244 supply power to the support chuck 224 for biasing and heating. The power source 244 may also supply power for movement of the lift assembly 220.

The gas line 242 is connected to a purge gas source 241. The gas line 242 is in fluid communication with the backside gas outlet 243. The purge gas supplied to the gas line 242 by the purge gas source 241 flows through the backside gas outlet 243 and provides backside gas to the bottom of the substrate 200 disposed on the substrate supporting surface 223.

The seal ring assembly 250 is disposed below and in contact with the upper lift section 230 of the support chuck 224. The seal ring assembly 250 extends radially outward from the central axis 205. The upper lift section 230 is disposed between the support chuck 224 and the seal ring assembly 250. The seal ring assembly 250 includes an inner assembly 252, an upper bellows ring 256, and an assembly bellows 254. The inner assembly 252 is circumscribed by the upper bellows ring 256. The assembly bellows 254 is seated between a lower bellows ring 258 of the inner assembly 252 and the upper bellows ring 256, such that the assembly bellows 254 applies a bias force from the lower bellows ring 258 toward the upper bellows ring 256. Otherwise stated, the bias force is applied along a y-direction 290, when the seal ring assembly 250 is oriented as shown in FIG. 2A. An x-direction 280 is orthogonal to the y-direction 290. The upper bellows ring 256 has an inner diameter between about 11 inches and about 14 inches, such as about 11.5 inches or about 12.5 inches. An outer diameter of the upper bellows ring 256 is between about 12 inches and about 15 inches, such as about 13.0 inches, or 13.5 inches. In another example, the outer diameter is between about 13.5 inches and about 15 inches, such as about 14.0 inches.

The assembly bellows 254 has a spring constant (k) of about 30 lbf/in to about 150 lbf/in, such as about 80 lbf/in, or about 90 lbf/in or about 100 lbf/in. In another example, the spring constant (k) is between about 55 lbf/in to about 75 lbf/in, such as about 60 lbf/in to about 70 lbf/in. As discussed below, in some embodiments, the spring rate of the assembly bellows 254 is selected to achieve a desired sealing force t within a desired range of extensions of the assembly bellows 254. In some embodiments, the spring constant (k) of the assembly bellows 254 varies depending upon the temperature of the processes performed within the chamber volume 278 as he assembly bellows 254 may change temperature proportional to the temperature within the chamber volume 278. In some embodiments, when the operating temperature within the chamber volume 278 is at a temperature of about 350 degrees C. to about 600 degrees C., the spring constant of the assembly bellows 254 is about 55 lbf/in to about 75 lbf/in, such as about 60 lbf/in to about 70 lbf/in. In other embodiments, when the chamber volume 278 is at an operating temperature of about 150 degrees C. to about 250 degrees C., the spring constant of the assembly bellows 254 is about 35 lbf/in to about 55 lbf/in, such as about 40 lbf/in to about 50 lbf/in. In yet other embodiments, when the operating temperature within the chamber volume 278 is about 20 degrees C. to about 150 degrees C., the spring constant of the assembly bellows 254 is about 15 lbf/in to about 35 lbf/in, such as about 20 lbf/in to about 30 lbf/in. The change in spring constant of the assembly bellows 254 over the variety of temperature ranges is due to the change in the young's modulus of the material contained in the assembly bellows 254. The assembly bellows 254 may also thermally expand or contract.

FIG. 2B includes the same components as FIG. 2A. FIG. 2B illustrates the processing assembly 160 when the lift assembly 220, including the support chuck 224, and the seal ring assembly 250, is in an upper position or the processing position. The lift assembly 220 is configured to move away from the bottom chamber wall 260 when positioned in the processing position. When the lift assembly 220 is in the upper position, the horizontal ringed portion 227 and the seal ring assembly 250 contact one another and form a seal. Moving the lift assembly 220 to the processing position pushes the upper bellows ring 256 toward the horizontal ringed portion 227, such that the seal is formed. The sealing surfaces of both the upper bellows ring 256 and the horizontal ringed portion 227 are parallel to the transfer plane of the substrate 200, as the substrate 200 moves through the transfer volume 236 between the processing assemblies 160. The transfer plane of the substrate 200 is a horizontal plane parallel to the substrate support surface 223. The substrate 200 is transferred between the processing assemblies along the transfer plane by a robot, such as the central transfer device 145, which is disposed within the transfer volume 236.

The seal ring assembly 250, the support chuck 224, the containment member 208, and the sputtering target assembly 203 define the chamber volume 278 when the lift assembly 220 is lifted to the processing position. While in the processing position, the horizontal ringed portion 227 and the upper bellows ring 256 are in contact and form the seal, enabling the chamber volume 278 to be fluidically isolated from the transfer volume 236. Otherwise stated, the seal between the horizontal ringed portion 227 of the processing assembly 160 and the upper bellows ring 256 forms a sealed chamber volume 278, shown in FIG. 2B. A process is performed on the substrate 200 within the chamber volume 278. When the lift assembly 220 is in the upper position, the seal between the lower annular portion 272 and the upper bellows ring 256 is not made, and the chamber volume 278 is not fluidically isolated from the transfer volume 236. For example, prior to engaging or subsequent to disengaging with the lower annular portion 272, the lift assembly 220 is in the upper position. It is understood herein, that the sealed chamber volume 278 is smaller than the chamber volume 278, because the seal ring assembly 250 when in the sealed position reduces the entirety of the chamber volume 278.

Figure 3:
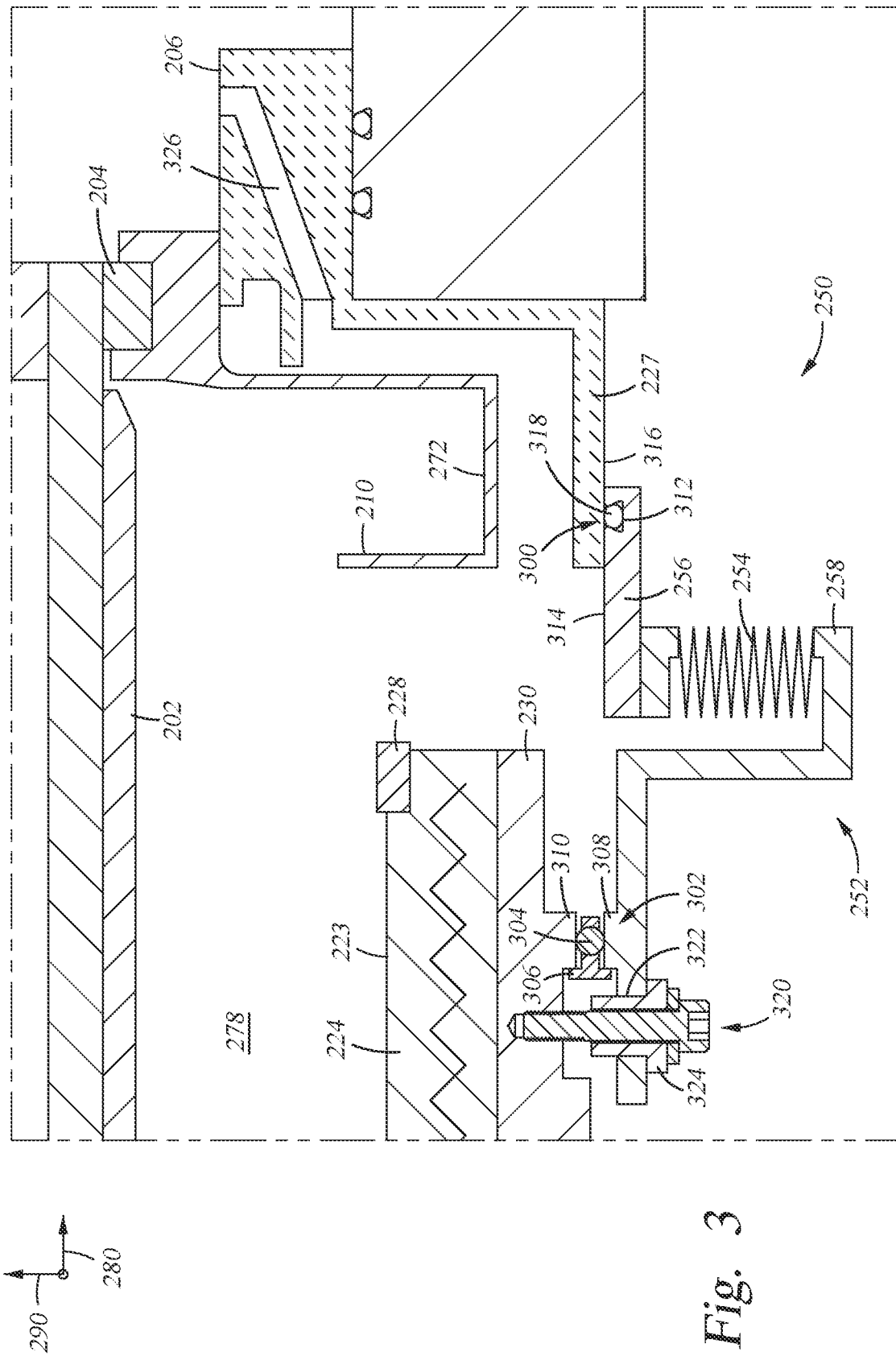
FIG. 3 is a schematic close-up cross sectional view of the interface between a seal ring assembly and a bellows assembly according to FIGS. 2A and 2B.

FIG. 3 is a schematic close-up cross sectional view of the interface between the seal ring assembly 250 and the horizontal ringed portion 227 according to FIG. 2B. An outer seal ring 300 is disposed on the upper bellows ring 256 and circumscribes an inner ring 302. The inner ring 302 is disposed between the upper lift section 230 of the support chuck 224 and the seal ring assembly 250. The inner ring 302 includes a fitting portion 306 and a sealing portion 304. The inner ring 302 is disposed between and in contact with a lower protrusion 308 of the seal ring assembly 250 and an upper protrusion 310 of the upper lift section 230. The inner ring 302 is under a constant compressive force between the lower protrusion 308 and the upper protrusion 310. The inner ring 302 is configured to prevent process gas leakage from the sealed chamber volume 278.

The outer seal ring 300 is disposed within a recessed channel 312 of the upper bellows ring 256. The outer seal ring 300 has an outer ring sealing surface 318 that abuts the recessed channel 312 and the lower sealing surface 316 of the horizontal ringed portion 227, when the seal ring assembly 250 is in the processing position. The recessed channel 312 is concentrically disposed within the upper bellows ring 256, such that each of the recessed channel 312 and the upper bellows ring 256 form a ring or circle. The recessed channel 312 extends beneath a sealing surface 314 of the upper bellows ring 256.

A plurality of fasteners 320 couples the seal ring assembly 250 to the support chuck 224. For simplicity, one fastener 320 is shown. The fastener 320 extends through a hole 322 in the inner assembly 252 into the upper lift section 230. As shown, the fastener 320 passes through a hole within the upper lift section 230, and extends partially into the upper lift section 230. However, it is understood that the fastener 320 may only extend partially through the upper lift section 230, without departing from the scope of the disclosure. An insulating ring 324 circumscribes the hole 322 so that the fastener 320 remains electrically isolated from the inner assembly 252 of the seal ring assembly 250. In at least one example, the insulating ring 324 is a ceramic, and made from a material that includes aluminum and oxygen, such as an alumina oxide.

A gas inlet 326 is fluidly connected to the chamber volume 278 providing a process gas thereto. During substrate processing, when the outer seal ring 300 is sealed between the lower annular portion 272 and the upper bellows ring 256, the gas inlet 326 provides a processing gas to the sealed chamber volume 278.

Figure 4:
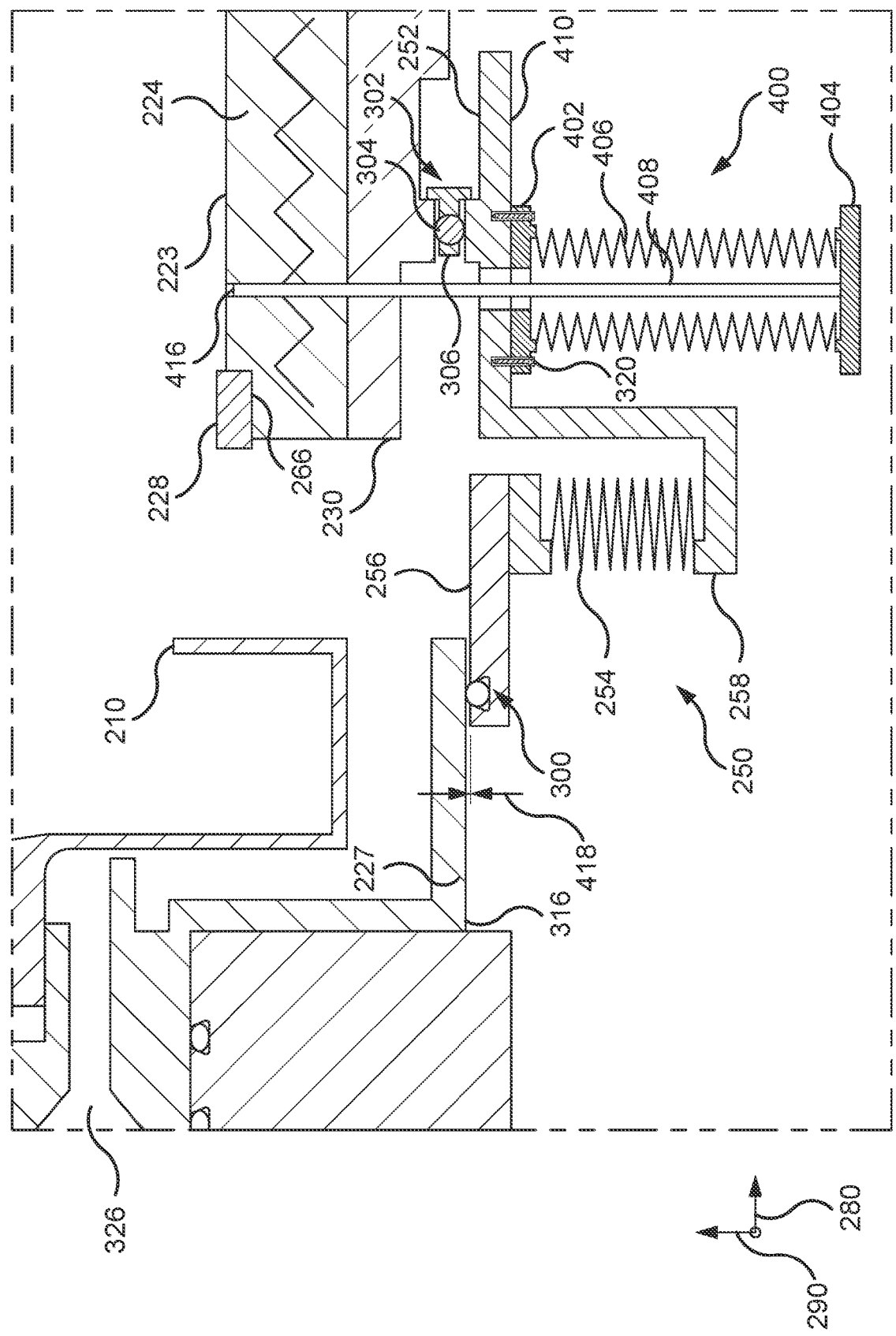
FIG. 4 is a schematic close-up cross sectional view of the interface between a support chuck and a lift pin assembly according to FIGS. 2A and 2B.

FIG. 4 is a schematic close-up cross sectional view of the interface between the support chuck 224 and a lift pin assembly 400 according to FIGS. 2A and 2B. The lift pin assembly 400 has an upper bellows support 402, a lower bellows support 404, a support bellows 406, and a lift pin 408. The spring constant of the support bellows 406 is within the same range of spring constants (k) as the assembly bellows 254. The upper bellows support 402 is affixed to an inner surface 410 of the inner assembly 252 by one or more fasteners 320. The support bellows 406 extends from the lower bellows support 404 to the upper bellows support 402 providing a bias force therebetween. Fasteners 320 couple the upper bellows support 402 to the inner surface 410 of the inner assembly 252 of the seal ring assembly 250. The support bellows 406 is coupled to upper bellows support 402 and the lower bellows support 404. In an additional example, the fasteners 320 include insulating rings 324 in order to electrically insulate the fasteners 320 from surrounding electrically conductive metals, in features described in FIGS. 3-5.

The lift pin 408 is bound by the lower bellows support 404 and extends in the y-direction 290. The lift pin 408 extends through the support bellows 406, passing through the inner assembly 252 of the seal ring assembly 250. Additionally, the lift pin 408 passes through the upper lift section 230 and the support chuck 224. As such, as the lift assembly 220, including the seal ring assembly 250, moves toward the bottom chamber wall 260, a top 416 of the lift pin 408 extends above the substrate support surface 223. When engaging the substrate 200 (shown in FIG. 2A), the lift pin 408 extends above the substrate supporting surface 223, so that the robot (i.e., the central transfer device 145 shown in FIG. 2A) can engage with the substrate 200. Although one lift pin 408 is shown, it is understood that there are additional lift pins 408 radially arranged about the central axis 205 of the support chuck 224. In one example, three lift pins 408 are radially disposed equidistantly around the support chuck 224. As the lift assembly 220 moves towards the sputtering target assembly 203, the top 416 of lift pin 408 can retreat beneath the substrate support surface 223, resting the substrate 200 upon the substrate support surface 223 (as shown in FIG. 2B).

In at least one example, a gap 418 is formed between the horizontal ringed portion 227 and the upper bellows ring 256 when the upper bellows ring 256 of the seal ring assembly 250 forms the sealed process chamber volume, i.e., when the chamber volume 278 is fluidically isolated from the transfer volume 236. The gap 418 is less than an outer diameter of the outer seal ring 300. For example, the gap 418 is between about 0.001 inches and about 0.1 inches, such as about 0.01 inches or about 0.025 inches. In another example, the gap 418 is about 0.015 inches to about 0.05 inches, such as about 0.03 inches. In yet another example, the gap 418 is between about 0.005 inches and about 0.02 inches. The gap 418 enables the seal ring assembly 250 to seal the chamber volume 278 without damaging the horizontal ringed portion 227 of the processing assembly 160.

Figure 5:
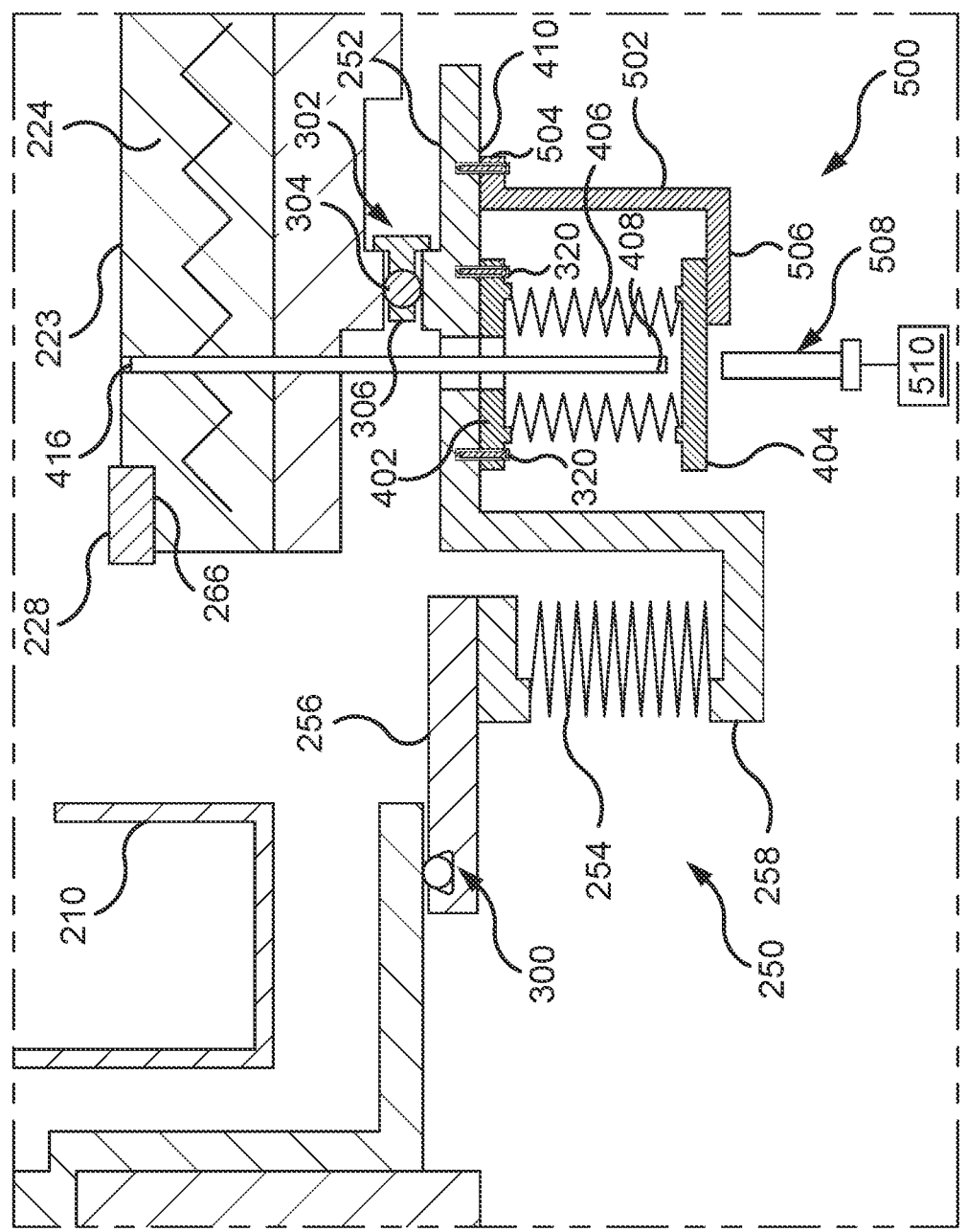
FIG. 5 is a schematic close-up cross sectional view of the interface between an alternative support chuck and an alternative lift pin assembly according to FIGS. 2A and 2B.

FIG. 5 is a schematic close-up cross sectional view of the interface between the support chuck and an alternative lift pin assembly 500 according to FIGS. 2A and 2B. The lift pin assembly 500 includes the upper bellows support 402, the lower bellows support 404, and a flange 502. The upper bellows support 402 is affixed to the inner surface 410 of the inner assembly 252 of the seal ring assembly 250. As noted above, the support bellows 406 is coupled to upper bellows support 402 and the lower bellows support 404. The lower bellows support 404 is configured to move relative to the inner surface 410 of the inner assembly 252.

The flange 502 has a top flange 504 affixed by one or more fasteners 320 to the inner surface 410 of the inner assembly 252. The flange 500 has a bottom flange 506 configured to abut the lower bellows support 404, preventing the lift pin 408 from extending too far below the substrate support surface 223 or the upper lift section 230. As such, the lower bellows support 404 is disposed between the upper bellows support 402 and the bottom flange 506.

When the lower bellows support 404 is engaged by an actuator 508, the lower bellows support 404 comes into contact with the lift pin 408 raising the lift pin in the positive y-direction 290. As similarly described above, when the lift pin 408 is raised above the substrate supporting surface 223, the top of lift pin 408 can lift the substrate 200 above the substrate supporting surface 223. When actuator 508 disengages with the lower bellows support 404, the lift pin 408 moves in the negative y-direction (i.e., towards the bottom chamber wall 260, shown in FIG. 4), lowering the substrate 200 to the substrate supporting surface 223 (shown in FIG. 2B). In this manner, the top 416 of the lift pin 408 extends below the substrate supporting surface 223. The actuator 508 may be coupled to a motor 510, and the motor 510 can be coupled to a power source, such as the power source 244. In one example, the actuator 508 includes a cylinder drive or screw drive that is coupled to the power source 286, the actuator 508 configured to extend and retract the lift pin 408.

Figure 6:
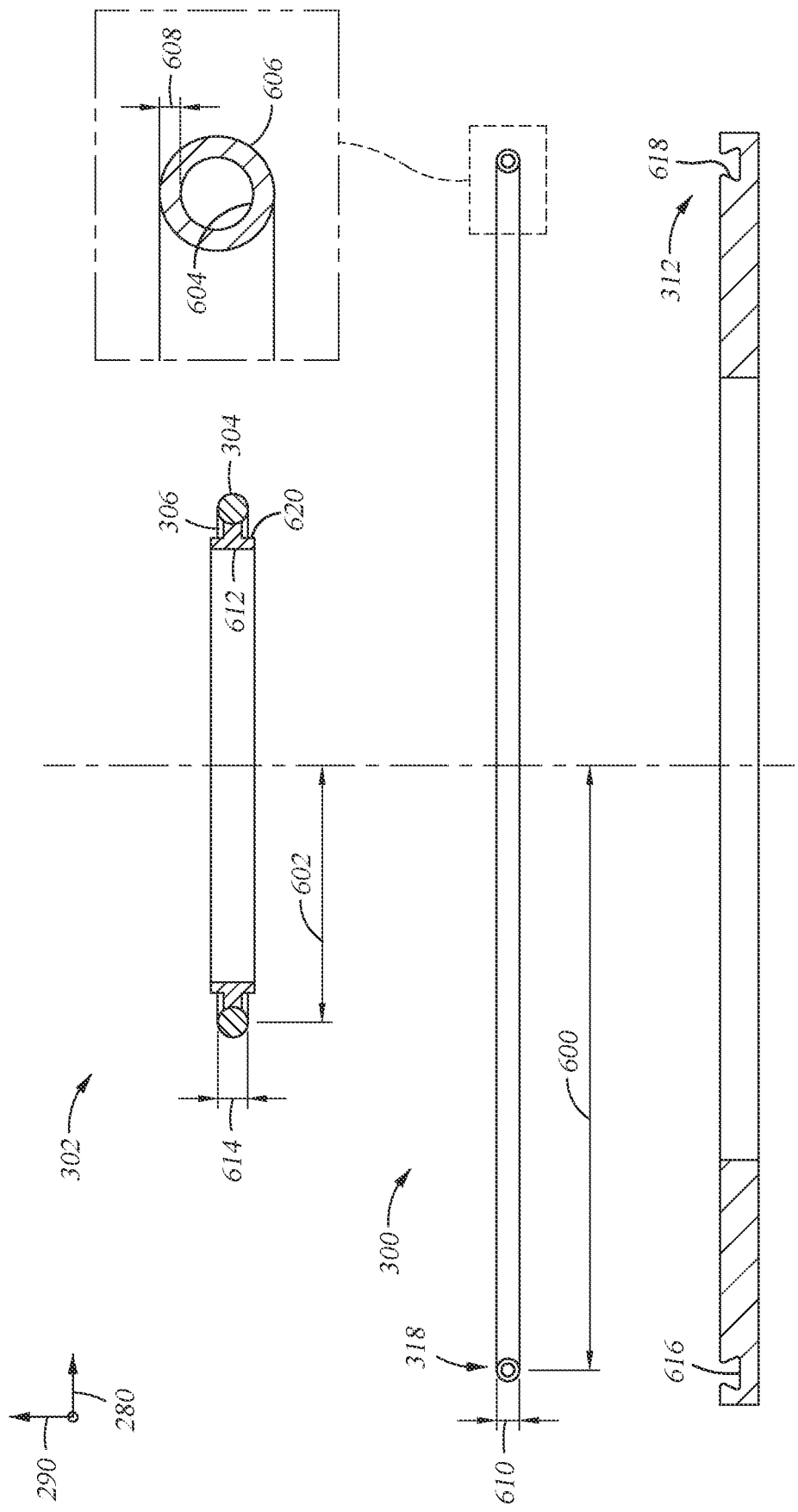
FIGS. 6A-6E are schematic close-up cross sectional views of an inner ring and an outer ring of a sealing ring, according to FIGS. 2B and 3B.

FIG. 6 is a schematic close-up cross sectional views of the inner ring and the outer ring of the sealing ring, shown in FIGS. 2A-5. The outer seal ring 300 has a radius 600 that is greater than a radius 602 of the inner ring 302. Accordingly, the inner ring 302 is completely circumscribed by the outer seal ring 300. As shown in FIGS. 3-5, the difference between the radius 602 and the radius 600 enable part of the sealed chamber volume 278 to be formed.

The outer seal ring 300 has an inner surface 604 that is circumscribed by an outer surface 606. A portion of the outer surface 606 forms the outer ring sealing surface 318, shown in FIG. 3. A distance between the inner surface 604 and the outer surface 606 define a thickness 608 of the outer seal ring 300. A diameter or height 610 of the outer seal ring 300 is less than a diameter or height 614 of the inner ring 302. A circumference or length of the outer seal ring 300 is defined by the radius 600 and can be between about 30 inches and about 60 inches, such as about 40 inches or about 50 inches. In another example, the circumference of the outer ring is between about 40 inches and about 55 inches, such as about 45 inches or about 50 inches. The thickness 608 is between 0.075 inches and about 0.030 inches.

In one example, the outer surface 606 of the outer seal ring 300 contacts a bottom 616 and each sidewall 618 of the recessed channel 312 when the outer seal ring 300 is not compressed, such as for example, as shown in FIGS. 2 and 5. In another example, the outer surface 606 outer seal ring 300 contacts the bottom of the recessed channel 312 and only one sidewall 618, when the outer seal ring 300 is not compressed, i.e., when the outer seal ring 300 is not forming the sealed chamber volume 278. Alternatively, the outer surface 606 may only touch the bottom 616 of the recessed channel 312. An exemplary outer seal ring 300 includes an O-ring cross-section, D-ring cross-section, or a quadrilateral cross-section. The outer seal ring 300 can be hollow or solid and have any of the aforementioned cross-sectional areas. The diameter or height 610 of the outer seal ring 300 is between about 0.05 and about 0.5 inches, such as about 0.1 inches, or between about 0.2 inches and about 0.4 inches, such as about 0.3 inches, or about 0.35 inches. In another example, the height 610 is between 0.2 inches and about 0.3 inches, such as about 0.25 inches.

As noted above, The outer seal ring 300 has an outer ring sealing surface 318 that abuts the recessed channel 312 and a lower sealing surface of the a horizontal ringed portion 227. As previously stated, a width of the recessed channel 312 is wider than an outer diameter of a cross-section of the outer seal ring 300. A width (i.e., a dimension taken in the x-direction 280) of the recessed channel 312 is between about 0.10 inches and about 0.15 inches. A height (i.e., taken in the y-direction 290) of the recessed channel 312 is between about 0.14 inches and about 0.20 inches, such as about 0.15 inches or about 0.16 inches. In order to maximize surface contact between the recessed channel 312 and the outer ring sealing surface 318 when the sealed chamber volume 278 is formed, the width of the recessed channel 312 can be less than the height.

As noted above, the inner ring 302 includes the sealing portion 304 and the fitting portion 306. The fitting portion 306 has an interior surface 612 and fitting surfaces 620, each extending along the y-direction 290 when disposed in the lift assembly 220. The inner ring 302 is disposed between the seal ring assembly 250 and the support chuck 224, such that one fitting surface 620 is in compressive contact with the seal ring assembly 250 in the x-direction 280 and the other fitting surface 620 is in compressive contact with the upper lift section 230 in the x-direction 280, or alternatively in contact with the support chuck 224. The fitting portion 306, including the fitting surfaces 620 provide force in a radial direction in order to substantially prevent the sealing portion 304 from slipping in the radial direction (i.e., an x-direction 280). For example, one fitting surface 620 is in contact with the lower protrusion 308 and the other fitting surface 620 is in contact with the upper protrusion 310 (FIG. 3). The interior surface 612 can be made from a metal, such as a metal containing steel, brass, or aluminum, or a combination thereof.

The sealing portion 304 is compressed in the y-direction 290 by the support chuck 224 and the seal ring assembly 250, or alternatively compressed by the upper lift section 230 and the seal ring assembly 250. The sealing portion 304 is substantially circular in order to maximize the compressive force between the seal ring assembly 250 and the support chuck 224, and in order to maximize the surface area between the sealing portion 304 support chuck 224, or the upper lift section 230. The sealing portion 304 is made from a material that includes a nitrile rubber, or alternatively, a material containing a fluorocarbon. The sealing portion 304, when disposed as shown in FIGS. 3-5, prevents leakage of gases from of the chamber volume 278.

Figure 7:
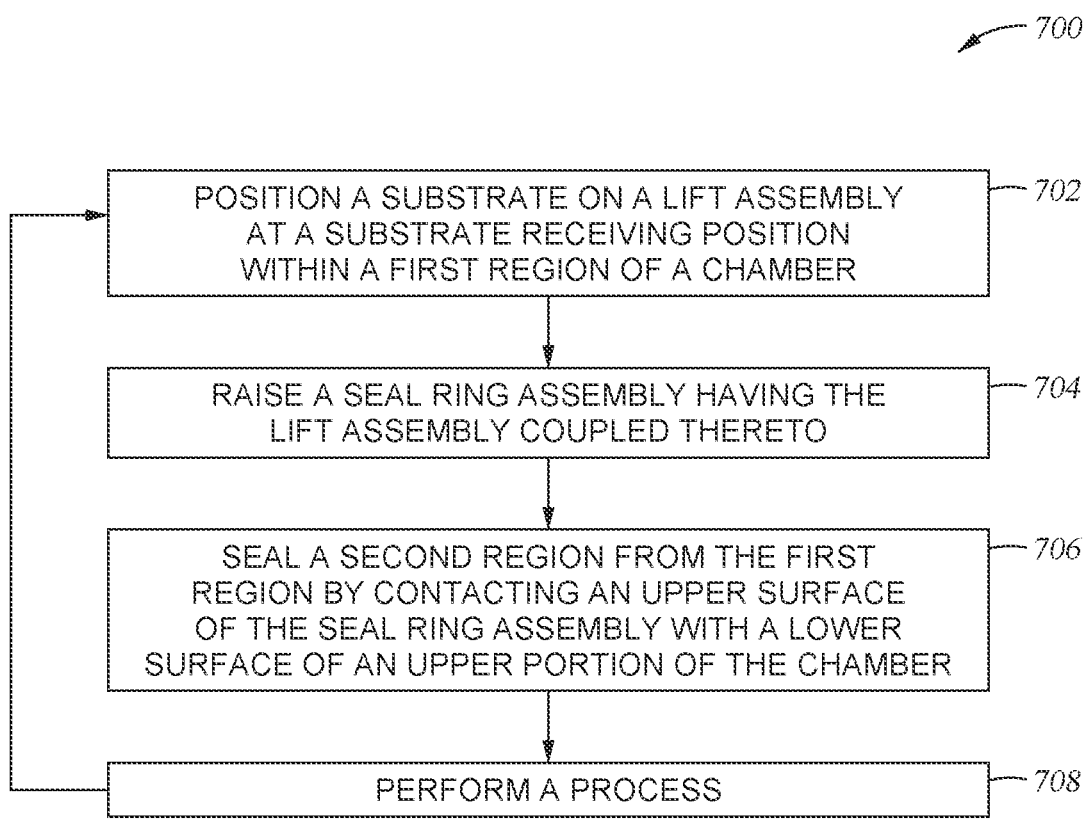
FIG. 7 is a method of transferring a substrate within a transfer volume and a chamber volume of FIGS. 2A-2B.

FIG. 7 depicts a flow chart of a method 700 of transferring a substrate within the transfer volume 236 and the chamber volume 278 of FIGS. 2A-2B. The method 700 is enabled by the apparatus described in FIGS. 2A-2B. In some embodiments, the method 700 may include additional process operations other than those described herein.

The first operation 702 of the method 700 is positioning a substrate on a lift assembly at a substrate receiving position (i.e., a first position) within a first region of a chamber. Operation 702 can also include positioning a support chuck into the first position on a robotic transfer device disposed within a transfer volume. In the first operation 702, the substrate support is the substrate support surface 223 of the support chuck 224. In the substrate receiving position as shown in FIG. 2A, the support chuck 224 and the lift assembly 220 are at a lower position in which a substrate 200 may be loaded thereon. The first region is the transfer chamber assembly 150 and the transfer volume 236 formed therein. The robot used in the first operation 702 is the central transfer device 145. Alternatively, the robot may be any suitable substrate transfer robot. The robot transfers the substrate 200 between the processing assemblies 160. The pressure in which the substrate 200 is exposed during the first operation 702 is a transfer volume pressure. The transfer volume pressure is about 10-9 Torr to about 10-4, such as about 10-8 Torr to about 10-5 Torr, or such as about 10-7 Torr to about 10-6 Torr.

The second operation 704 of the method 700 is raising a seal ring assembly having the lift assembly coupled thereto. Operation 704 can also including raising a lift assembly to couple to the support chuck. The robotic transfer device disengages from the support chuck prior to raising the lift assembly. The lift assembly 220 enables the vertical motion of the substrate support and the substrate. The substrate support and the substrate are lifted at a rate sufficient to expedite the rate of substrate processing, while not damaging the substrate. The seal ring assembly, the lift assembly 220, and the support chuck 224 are attached to each other and lifted at the same rate for the entirety of the lifting operation.

The third operation 706 of the method 700 includes sealing a second region from the first region by contacting an upper surface of the seal ring assembly with a lower surface of an upper portion of the chamber. For example, an outer ring sealing surface 318 of an outer seal ring 300 is sealed against a lower sealing surface 316, forming a processing volume, such as the sealed chamber volume 278 (i.e., a processing volume). The outer seal ring 300 is under compressive stress when sealed against the lower sealing surface 316. The sealed chamber volume 278 is smaller than the unsealed chamber volume 278, i.e., when the chamber volume 278 is not fluidly isolated from the transfer volume 236. During the third operation 706, the substrate support and the substrate are lifted so that the substrate support and the substrate are in a processing position as shown in FIG. 2B. In the processing position, the seal ring assembly 250 is in contact with the support chuck 224 and a seal is formed between the transfer volume 236 and the chamber volume 278. Alternatively, the seal ring assembly 250 is in contact with the upper lift section 230 when the seal is formed between the transfer volume 236 and the chamber volume 278.

In this embodiment, the transfer volume 236 is the first region and the chamber volume 278 is the second region. For example, sealing an outer sealing surface of an outer ring against a lower sealing surface of at least one chamber wall to form a processing volume creates a seal between the transfer volume 236 and the chamber volume 278. Creating the seal, as described in the third operation 706, enables the chamber volume 278 to be pumped to a different pressure than the transfer volume 236. Pumping the chamber volume 278 to a different pressure allows different processes to be performed within each of the processing assemblies 160 within the cluster tool assemblies 100a, 100b. In one example, a pressure differential between the sealed chamber volume 278 and the transfer volume 236 can be between 50 Torr and about 500 Torr, such as between about 250 Torr and about 350, such as about 300 Torr. In another example, the difference between sealed chamber volume 278 and transfer volume 236 is between about 150 Torr and about 400 Torr, such as about 200, Torr, or about 350 Torr. In another example, the pressure differential between sealed chamber volume 278 and transfer volume 236 is less than about 400 Torr.

The fourth operation 708 of the method 700 is performing a process on the substrate. The process is one of a PVD, CVD, ALD, etch, cleaning, heating, annealing, and/or polishing process. The process is performed in the chamber volume 278. In one example described herein, the process performed within the sealed chamber volume 278 is a PVD process. The PVD process produces thin films and coating on the substrate 200. The PVD process may deposit tantalum, copper, aluminum, cobalt, ruthenium, molybdenum, zinc, chromium, gold, palladium, titanium, silicon or other metals and metal containing compounds.

After performing the process in the fourth operation 708 on the substrate, the chamber volume 278 may be purged and the support chuck 224 can be lowered back to the substrate receiving position. A robot removes the substrate 200 from the support chuck 224 and the method 700 is repeated with a different substrate. In some embodiments, a single processing assembly 160 may process a substrate multiple times during the life of the substrate.

The present disclosure generally relates to a bellows assembly and method of isolating a chamber volume within a substrate processing chamber utilizing the bellows assembly. Advantageously, the isolation of the processing volume from the transfer volume by the movement of the bellows assembly allows for each of the processing volumes to be adjusted to different pressures, enabling different substrate processing steps to be performed within each of the processing assemblies. While the foregoing is directed to specific examples, other examples may be devised without departing from the basic scope thereof, and the scope thereof is determined by the claims that follow.

What we claim is:

1. A substrate processing chamber comprising:
    an upper wall, and a bottom wall, a liner disposed between the upper wall and the bottom wall, and a containment member coupled to an internal surface of the liner, wherein the containment member has a lower sealing surface;
    a support chuck having a substrate supporting surface, and a bottom surface opposite the substrate supporting surface;
    a seal ring assembly coupled to the bottom surface of the support chuck, the seal ring assembly comprising:
        an upper bellows ring;
        a lower bellows ring attached to an inner assembly; and
        an assembly bellows disposed between the upper bellows ring and the lower bellows ring;
        an outer seal ring disposed between the upper bellows ring and the lower sealing surface, the outer seal ring having an outer sealing surface, the outer seal ring extending radially around a center of the seal ring assembly; and
    a lift assembly configured to move the support chuck between:
        a transfer position, wherein the substrate supporting surface is exposed to a first region, and
        a processing position, wherein the substrate support surface is in a second region isolated from the first region by contact between the seal ring assembly, the outer ring seal, and the lower sealing surface of the containment member.

2. The substrate processing chamber of claim 1, wherein the seal ring assembly further comprises:
    a recessed channel in a top surface of the upper bellows ring, wherein the outer seal ring is disposed in the recessed channel.

3. The substrate processing chamber of claim 2, further comprising:
    an inner seal ring disposed between a top surface of inner assembly of the seal ring assembly and a bottom surface of the support chuck.

4. The substrate processing chamber of claim 1, further comprising a lift pin assembly, comprising:
    an upper support affixed to an inner surface of the seal ring assembly;
    a lower support opposite the upper support;
    a second bellows disposed between the upper support and the lower support; and
    a lift pin passing through the upper support, wherein the lift pin is configured to lift a substrate above the substrate supporting surface.

5. The substrate processing chamber of claim 4, wherein the lower support is moveable relative to the inner surface.

6. The substrate processing chamber of claim 4, wherein the lift assembly further comprises:
    a flange coupled to the inner surface of the inner assembly, the flange further comprising a bottom flange, and wherein the lower support is disposed between the upper support and the bottom flange.

7. The substrate processing chamber of claim 1, further comprising:
    an inner ring disposed between inner assembly of the seal ring assembly and the bottom surface of the support chuck.

8. The substrate processing chamber of claim 1, wherein the outer sealing surface forms an isolation seal with a lower sealing surface and forms the second region.

9. The substrate processing chamber of claim 1, wherein the outer seal ring contains a fluorocarbon compound, and has a cross-sectional outer diameter of between about 0.3 inches and about 0.1 inches.

10. The substrate processing chamber of claim 1, wherein the outer seal ring has a diameter between about 12 inches and about 17 inch, and has a hollow center.

11. An apparatus configured to simultaneously process a plurality of substrates, comprising:
    a transfer chamber assembly having one or more walls that define a transfer volume;
    a substrate processing assembly comprising an upper wall, and a bottom wall, a liner disposed between the upper wall and the bottom wall, and a containment member coupled to an internal surface of the liner, wherein the containment member has a lower sealing surface; each substrate processing assembly comprising:
    a support chuck having a substrate supporting surface, and a bottom surface opposite the substrate supporting surface;
    a seal ring assembly coupled to the bottom surface of the support chuck, the seal ring assembly comprising:
        an upper bellows ring;
        a lower bellows ring attached to an inner assembly; and
        an assembly bellows disposed between the upper bellows ring and the lower bellows ring;
    an outer seal ring disposed between the upper bellows ring and the lower sealing surface, the outer seal ring having an outer sealing surface, the outer seal ring extends radially around a center of the seal ring assembly, and wherein the outer sealing surface forms an isolation seal with the lower sealing surface and forms a sealed process chamber volume; and
    a lift assembly configured to move the support chuck between:
        a transfer position, wherein the substrate supporting surface is exposed to a first region, and
        a processing position, wherein the substrate supporting surface is in a second region isolated from the first region by contact between the seal ring assembly, the outer ring seal, and the lower sealing surface of the containment member.

12. The substrate processing chamber of claim 11, wherein the seal ring assembly further comprises:
    a recessed channel in a top surface of the upper bellows ring, wherein the outer seal ring is disposed in the recessed channel.

13. The substrate processing chamber of claim 12, further comprising:
    an inner seal ring disposed between a top surface of inner assembly of the seal ring assembly and a bottom surface of the support chuck.

14. The substrate processing chamber of claim 11, wherein the lift assembly further comprises:
- an upper support affixed to an inner surface of the seal ring assembly;
- a lower support opposite the upper support;
- a lift bellows disposed between the upper support and the lower support; and
- a lift pin passing through the upper support, wherein the lift pin is configured to lift a substrate above the substrate supporting surface.

15. The substrate processing chamber of claim 14, wherein the lower support is coupled to at least one bottom chamber wall.

16. The substrate processing chamber of claim 14, wherein the lift assembly further comprises:
- a baffle coupled to the inner surface of the inner assembly, the baffle further comprising a lip, and wherein the lower support is disposed the upper support and the lip of the baffle.

17. A semiconductor processing system, comprising:
- a substrate processing chamber having a plurality of chamber walls forming a chamber volume therebetween; and
- a non-transitory computer readable medium storing instructions, the instructions when executed by a processor cause a method to be performed in the substrate processing chamber, the method comprising:
  - positioning a substrate and a support chuck into a first position on a robotic transfer device within a transfer volume;
  - raising a lift assembly to couple to the support chuck;
  - disengaging the support chuck from the robotic transfer device;
  - raising the support chuck to a second position with the lift assembly;
  - sealing an outer sealing surface of an outer seal ring against a lower sealing surface of at least one chamber wall to form a processing volume, the processing volume being smaller than the chamber volume, and wherein the processing volume is fluidly isolated from the transfer volume; and
  - processing the substrate in the processing volume.

18. The semiconductor processing system of claim 17, wherein the method further comprises:
- compressing an inner seal ring between a lower surface of the support chuck and an upper surface of a seal ring assembly, wherein the inner seal ring and the outer seal ring are disposed in the seal ring assembly, and the outer seal ring circumscribes the inner seal ring.

19. The semiconductor processing system of claim 17, wherein the method further comprises:
- pumping the chamber volume to a pressure different from a pressure within the transfer volume.

20. The semiconductor processing system of claim 17, wherein the method further comprises:
- compressing the outer ring such that deflection of an outer diameter of the outer ring is greater than 0.25 inches.

* * * * *